United States Patent
Lin et al.

(10) Patent No.: US 8,957,819 B2
(45) Date of Patent: Feb. 17, 2015

(54) DIELECTRIC ANTENNA AND ANTENNA MODULE

(75) Inventors: Hung-Hsuan Lin, Hsinchu County (TW); Ta-Chun Pu, Kaohsiung (TW); Chun-Yih Wu, Taipei (TW)

(73) Assignee: Industrial Technology Research Institute, Hsinchu (TW)

( * ) Notice: Subject to any disclaimer, the term of this patent is extended or adjusted under 35 U.S.C. 154(b) by 208 days.

(21) Appl. No.: 13/491,604

(22) Filed: Jun. 8, 2012

(65) Prior Publication Data
US 2013/0169499 A1    Jul. 4, 2013

(30) Foreign Application Priority Data
Dec. 30, 2011   (TW) ............................... 100149856 A

(51) Int. Cl.
*H01Q 13/00* (2006.01)

(52) U.S. Cl.
USPC ............................. 343/776; 343/772; 343/785

(58) Field of Classification Search
CPC .......... H01Q 1/38; H01Q 1/243; H01Q 13/06
USPC ......................................... 343/785, 776, 772
See application file for complete search history.

(56) References Cited

U.S. PATENT DOCUMENTS

| | | | | |
|---|---|---|---|---|
| 2,801,413 | A | * | 7/1957 | Beck .............................. 343/785 |
| 4,053,894 | A | * | 10/1977 | Beckmann ..................... 343/785 |
| 4,673,945 | A | * | 6/1987 | Syrigos ......................... 343/755 |
| 5,017,937 | A | * | 5/1991 | Newham et al. .............. 343/785 |
| 5,495,262 | A | | 2/1996 | Klebe |
| 5,550,553 | A | * | 8/1996 | Yamaki et al. ................ 343/785 |
| 5,757,323 | A | | 5/1998 | Spencer |
| 6,201,508 | B1 | | 3/2001 | Metzen et al. |
| 6,208,308 | B1 | | 3/2001 | Lemons |
| 6,384,796 | B1 | | 5/2002 | Reimann et al. |
| 7,012,572 | B1 | | 3/2006 | Schaffner et al. |
| 7,109,939 | B2 | | 9/2006 | Lynch et al. |
| 7,109,940 | B1 | | 9/2006 | Volman |
| 7,289,078 | B2 | | 10/2007 | Navarro |
| 7,504,721 | B2 | | 3/2009 | Chen et al. |
| 7,961,153 | B2 | | 6/2011 | Haziza |
| 2002/0030632 | A1 | | 3/2002 | Popa et al. |
| 2009/0303147 | A1 | | 12/2009 | Choudhury |
| 2010/0171674 | A1 | | 7/2010 | Henderson |

(Continued)

FOREIGN PATENT DOCUMENTS

CN    101142713    3/2008
TW    M352140    3/2009

OTHER PUBLICATIONS

Natarajan et al., "A Fully-Integrated 16-Element Phased-Array Receiver in SiGe BiCMOS for 60-GHz Communications", IEEE Journal of Solid-State Circuits, vol. 46, No. 5, May 2011, p. 1059-p. 1075.

(Continued)

*Primary Examiner* — Tan Ho
(74) *Attorney, Agent, or Firm* — Jianq Chyun IP Office

(57) ABSTRACT

A dielectric antenna includes at least one dielectric unit. Each dielectric unit is separated into a first region and a second region, and the second region could have a bending portion. A conductor covers a surface of the second region of the dielectric unit to form a waveguide structure. The waveguide structure has a first endpoint connected to the first region and a second endpoint serving as a signal feeding terminal for feeding or receiving signals.

17 Claims, 17 Drawing Sheets

(56) References Cited

U.S. PATENT DOCUMENTS

2010/0214185 A1    8/2010  Sammoura et al.
2010/0238085 A1    9/2010  Fuh et al.
2011/0068990 A1    3/2011  Grzyb et al.

OTHER PUBLICATIONS

Fakharzadeh et al., "CMOS Phased Array Transceiver Technology for 60 GHz Wireless Applications", IEEE Transactions on Antennas and Propagation, vol. 58, No. 4, Apr. 2010, p. 1093-p. 1104.

Gao et al., "Implementation Considerations of Patch Antenna Array for 60GHz Beam Steering System Applications", IEEE Radio and Wireless Symposium, Jan. 18-22, 2009, p. 35-p. 38.

Liu et al., "A Superstrate Patch Antenna for 60-GHz Applications", Antennas and Propagation, 3rd European Conference on Antennas and Propagation, Mar. 23-27, 2009, p. 2592-p. 2594.

Li et al., "Wideband Planar Antennas for Millimeter-Wave Wireless Communications," Antennas and Propagation Society International Symposium, 2008, p. 1-p. 4.

Bhattacharyya et al., Phased Array Antennas—Floquet Analysis, Synthesis, BFNs, and Active Array Systems, 2006, Wiley.

Artemenko et al., "Beam Steerable Quartz Integrated Lens Antenna for 60 GHz Frequency Band," Proceedings of the 5th European Conference on Antennas and Propagation, Apr. 11-15, 2011, p. 758-p. 762.

Nguyen et al., "Focal Array Fed Dielectric Lenses: An Attractive Solution for Beam Reconfiguration at Millimeter Waves," IEEE Transactions on Antennas and Propagation, vol. 59, No. 6, Jun. 2011, p. 2152-p. 2159.

Wu et al.,"Design and characterization of single- and multiple-beam mm-wave circularly polarized substrate lens antennas for wireless communications," IEEE Transactions on Microwave Theory and Techniques, Mar. 2001, vol. 49, Issue 3, p. 431-p. 441.

Konishi et al., "Millimeter-Wave Plastic Waveguide Phased Array Antenna," IEEE AP-S Symposium on AP/URSI, Jul. 11-17, 2010, p. 1-p. 4.

Pardalopoulou et al., "A Novel Waveguide Radiator Array Element for Metallized Plastics Antenna Technology," Internationale Antennentagung der VDE-ITG, Berlin, Sep. 2003, p. 1-p. 3.

Kishk et al., "Radiation Characteristics of the Short Dielectric Rod Antenna: A Numerical Solution," IEEE Transactions on Antennas and Propagation, vol. AP-35, No. 2, Feb. 1987, p. 139-p. 146.

Kumar et al., "Design of Short Axial Length High Gain Dielectric Rod Antennal", IEEE Transactions on Antennas and Propagation, vol. 5, Dec. 2010, p. 4066-p. 4069.

Hal Schrank, et al., "The Shaped-Beam Polyrod Antenna," IEEE Antennas and Propagation Magazine, vol. 36, No. 2, Apr. 1994 , pp. 55-57.

Yizhe Zhang, et al., "Analysis of Dielectric Resonator Antenna Arrays With Supporting Perforated Rods," The Second European Conference on Antennas and Propagation, Nov. 11-16, 2007, pp. 1-5.

"Office Action of China Counterpart Application", issued on Oct. 22, 2014, p. 1-p. 8, in which the listed references were cited.

"Office Action of Taiwan Counterpart Application", issued on Dec. 12, 2014, p. 1-p. 4, in which the listed reference was cited.

\* cited by examiner

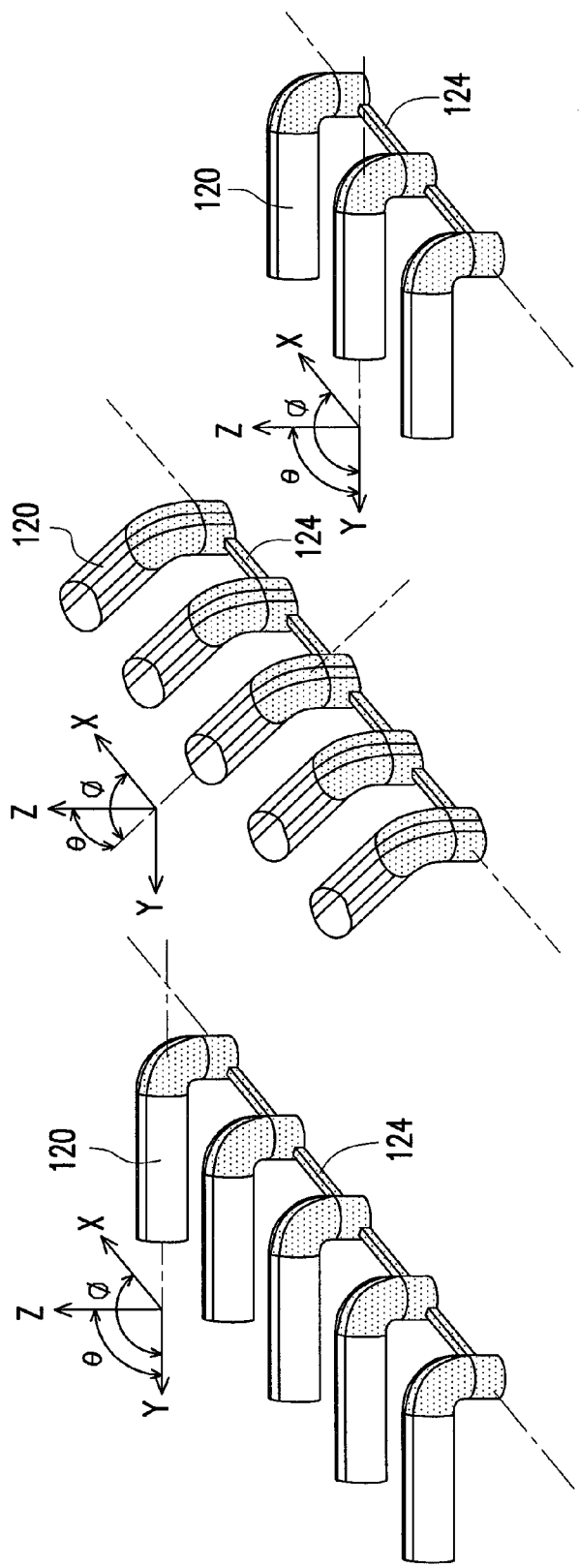

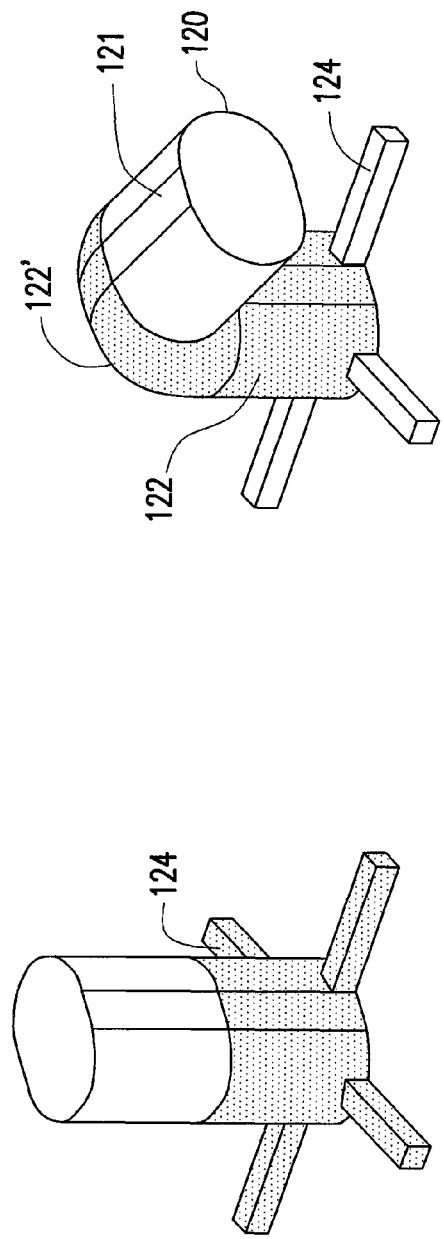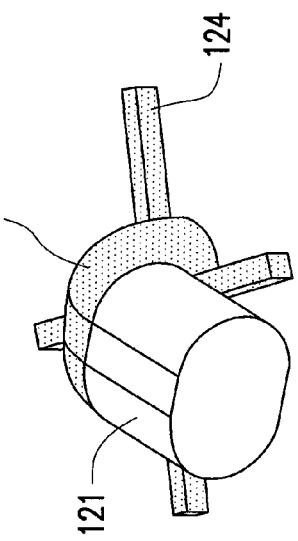
FIG. 13A
FIG. 13B
FIG. 13C

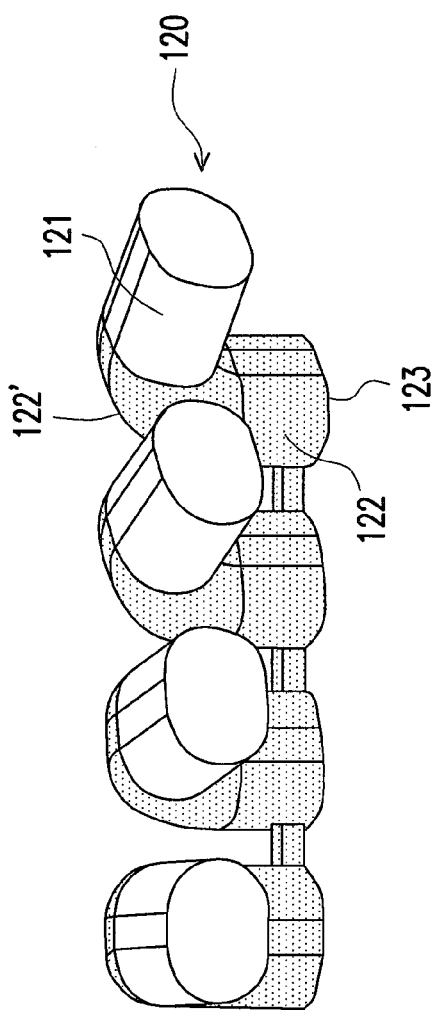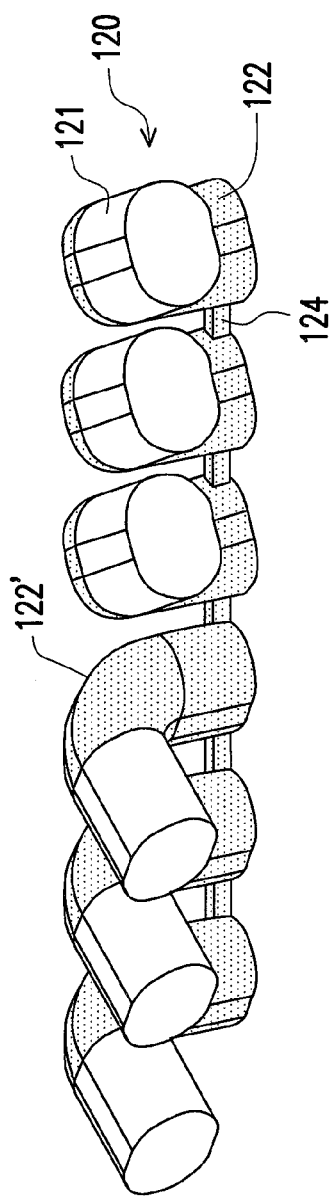
FIG. 13D
FIG. 13E

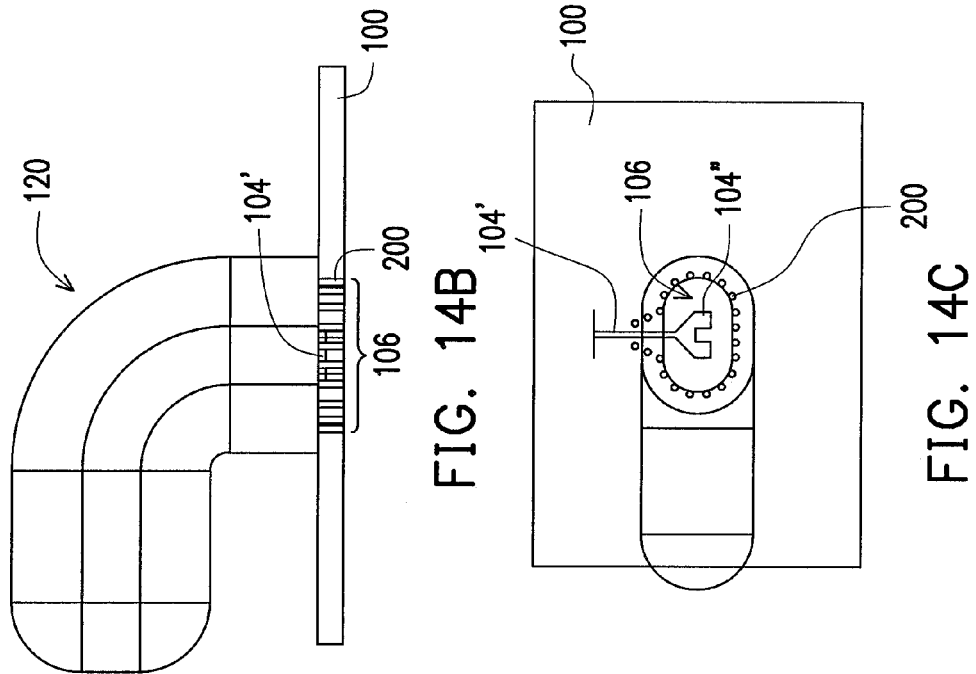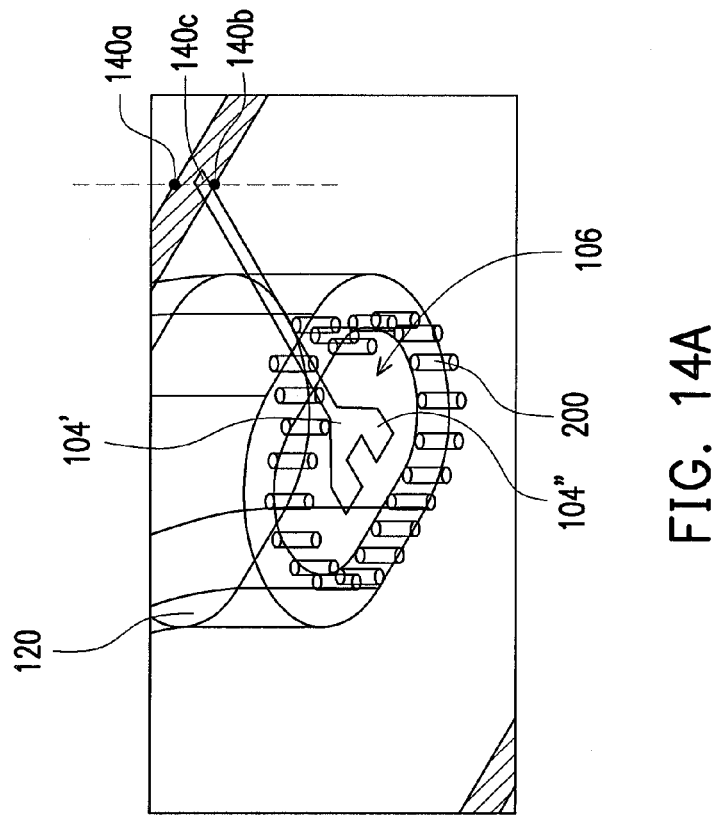

DIELECTRIC ANTENNA AND ANTENNA MODULE

CROSS-REFERENCE TO RELATED APPLICATION

This application claims the priority benefit of Taiwan application serial no. 100149856, filed on Dec. 30, 2011. The entirety of the above-mentioned patent application is hereby incorporated by reference herein and made a part of this specification.

TECHNICAL FIELD

The disclosure relates to an antenna technology and more particularly to a dielectric antenna.

BACKGROUND

The antenna is an essential component in wireless communication. As the demand for the amount of wirelessly transmitted data increases, the availability of a large bandwidth, such as a 7 GHz bandwidth for the 60 GHz band millimeter-wave, allows for a wide variety of applications in communication. On the other hand, due to the advancement in semiconductor manufacturing technology, the millimeter-wave single chip radio-frequency integrated circuit (RFIC) can be fabricated by many commercial foundry services. In comparison to the conventional module fabricated by discrete components, the integrated chip can reduce the module size, decrease the complexity in assembly, lower the manufacturing cost, and provide the essential function of beam switching.

Using the millimeter-wave as an example, since the 60 GHz millimeter-wave loses a large amount of transmission in the atmosphere, it requires more EIPR (Equivalent Isotropically Radiated Power) to compensate for the transmission loss and achieve the requirement of high-speed data transmission. EIPR is the product of the output power of transmitter (PTx) and the antenna gain (Gain), that is, EIRP=PTx×Gain. However, the power-add efficiency (PAE) for the current design of silicon-based solid-state amplifier operated in the millimeter-wave band is roughly around 10%, and the output power is also very limited. Therefore, increasing the antenna gain becomes the most effective method in order to improve the EIRP.

The size of the antenna is proportional to the wavelength. The wavelength of the millimeter-wave is shorter than the microwave. For instance, the wavelength of the millimeter-wave in vacuum is only approximately 5 mm at 60 GHz. Conventionally, the side length for the typical patch antenna fabricated on a dielectric substrate is roughly 2 mm. Consequently, the level of fabrication precision and assembly alignment accuracy needed for the millimeter-wave antenna, in general, would be relatively higher than the microwave antenna. Since the array antenna module is constructed with a large number of units, the degree of difficulty in precision control would be even greater.

Taking into considerations the vigorous development of chip technology and the device volume, cost and the integration of antenna and chip, the antenna module can generally be manufactured by applying the technology of multi-layer low temperature co-fired ceramic (LTCC). The multi-layer LTCC technology can be used as the carrier board for the RF front-end chip, and the low-loss characteristic provides the circuit route for the millimeter-wave RF signal and the fabrication of a patch array antenna. However, the dielectric constant for the LTCC is relatively high, such as approximately 5 to 8, and the layers are thin. As a result, the gain for a single conventional patch antenna is just around 4-6 dBi. Therefore, in order to satisfy the system requirement, more units are required to form an array, and the number of units in array is usually between 16 and 64.

Although the single antenna module is able to reach a higher gain in array, nevertheless, the angular coverage for the main beam of the antenna is not sufficiently wide. Accordingly, applicability in the complex wireless communication environment will be extremely difficult.

SUMMARY

The disclosure provides an exemplary embodiment of a dielectric antenna, including multiple dielectric units, at least one conductive structure, at least one interconnect structure, and a plurality of signal feeding structures. Each dielectric unit is separated into a first region and a second region. The aforementioned conductive structure covers the surface of the second region of each individual dielectric unit to form a waveguide structure. A first end of this waveguide structure is connected with the first region, and a second end of the waveguide structure is a signal feeding terminal. The interconnect structure is connected with the at least one waveguide structure to form at least one integrated structure. The interconnect structure has a transverse width, which is smaller than a critical size. A signal feeding structure has an endpoint adjacent to the signal feeding terminal of the waveguide structure for feeding or receiving signals.

The disclosure provides an exemplary embodiment of a dielectric antenna, including a dielectric unit and a conductive structure. The dielectric unit is separated into a first region and a second region, and the second region possesses of a bending portion. The conductive structure covers the second region to form a waveguide structure. A first end of this waveguide structure is connected with the first region, and a second end of the waveguide structure is a signal feeding terminal.

The disclosure provides an exemplary embodiment of an antenna module, including a carrier board, a plurality of dielectric units and at least one conductive structure. The carrier board includes a plurality of conductive layers, which comprise a first conductive layer with multiple openings at a side of the carrier for grounding, and a second conductive layer with multiple signal feeding structures, respectively having an endpoint corresponding to one of the openings of the first conductive layer. The dielectric unit is respectively configured on the openings, wherein each individual dielectric unit is separated into a first region and a second region. The conductive structure covers the surface of the second region of these dielectric units to form a waveguide structure respectively. A signal feeding terminal of each waveguide structure corresponds to one of the openings of the first conductive layer, respectively. An endpoint of the signal feeding structure is disposed to the corresponding waveguide structure, respectively, for feeding or receiving signals from the signal feeding terminal of each waveguide structure.

The following description would illustrate several exemplary embodiments, which are accompanied with figure drawings to provide further explanation of the disclosure as claimed.

DRAWINGS

The accompanying drawings are included to provide further understanding of the disclosure, and are incorporated in and constitute a part of this specification. The drawings illustrate exemplary embodiments and, together with the description, serve to explain the principles of the disclosure.

FIGS. 8A-8C are schematic diagrams illustrating several possible bending arrangements for the antenna module in accordance with an embodiment of the disclosure.

FIGS. 13A-13E are schematic diagrams illustrating a dielectric antenna with various interconnect structures in accordance with an embodiment of the disclosure.

FIGS. 14A-14D are respectively schematic, three-dimensional, side, top, and front perspective views illustrating the connection portion between the dielectric unit and the carrier board in accordance with an embodiment of the disclosure.

DETAILED DESCRIPTION

In the disclosure, the dielectric antenna is adopted for the antenna, which can be packaged with an integrated circuit chip, and it is suitable for applications such as the high gain antenna module at millimeter wave. In addition, the antenna can be used with LTCC technology to produce a multilayer circuit carrier.

The structure of the dielectric antenna and the assembled antenna module provided in the disclosure can meet the precision requirement and can be easily assembled. In addition, multiple emitting beams with different angles can be combined to adapt to various apparatuses changing locations in the environment. Therefore, the operation efficiency can be easily improved.

The antenna module in the disclosure can be simply constructed, has high density units, is capable of integrating with the current planar carrier, has a high antenna gain, and is adjustable in accordance with actual requirement. For example, the structure of the antenna can be bent at an angle to change the wave beam direction of the antenna. The various configurations of beam coverage can be realized by using phased array, switching between different sets of antenna arrays, which is useful for integration in thin apparatuses.

The antenna unit combines the waveguide structure and the dielectric unit, known as the radiator. During the implementation, the antenna unit can be extended perpendicularly, in order to achieve high-density integration with the planar carrier board. The gain of the antenna unit would increase as the length of the dielectric unit increases. The waveguide structure can be bent and maintains the low-loss characteristic, without the limitations of the fundamental beam direction when integrated with the planar carrier board. The structure of antenna module can be fabricated by using plastic injection molding, for example, which allows for mass production and low manufacturing cost.

Several embodiments are provided for descriptions. However, the disclosure is not just limited to the embodiments. In addition, a proper combination between the embodiments can also be made.

Figure 1:
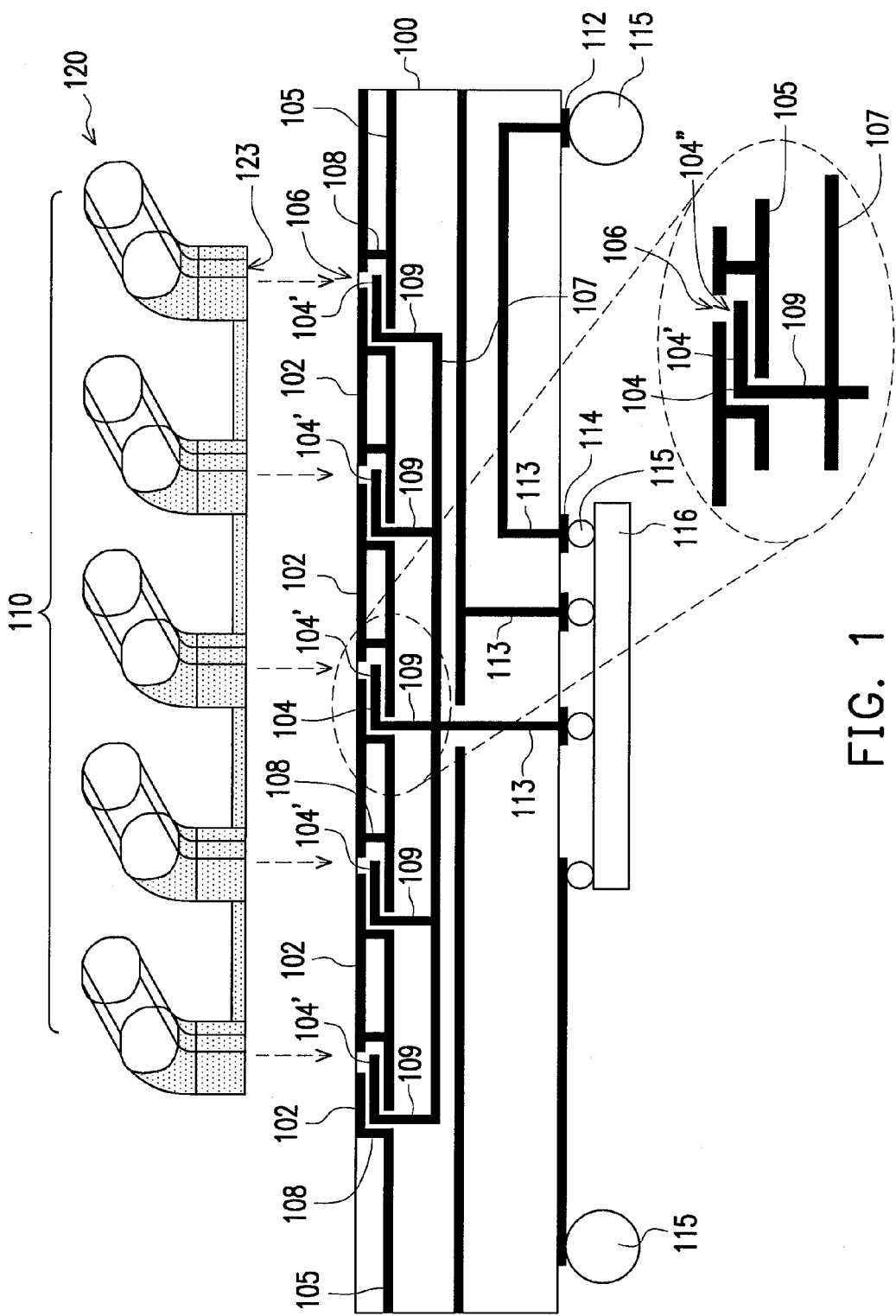
FIG. 1 is a schematic cross-sectional view illustrating an antenna module in accordance with an embodiment of the disclosure.
Figure 3:
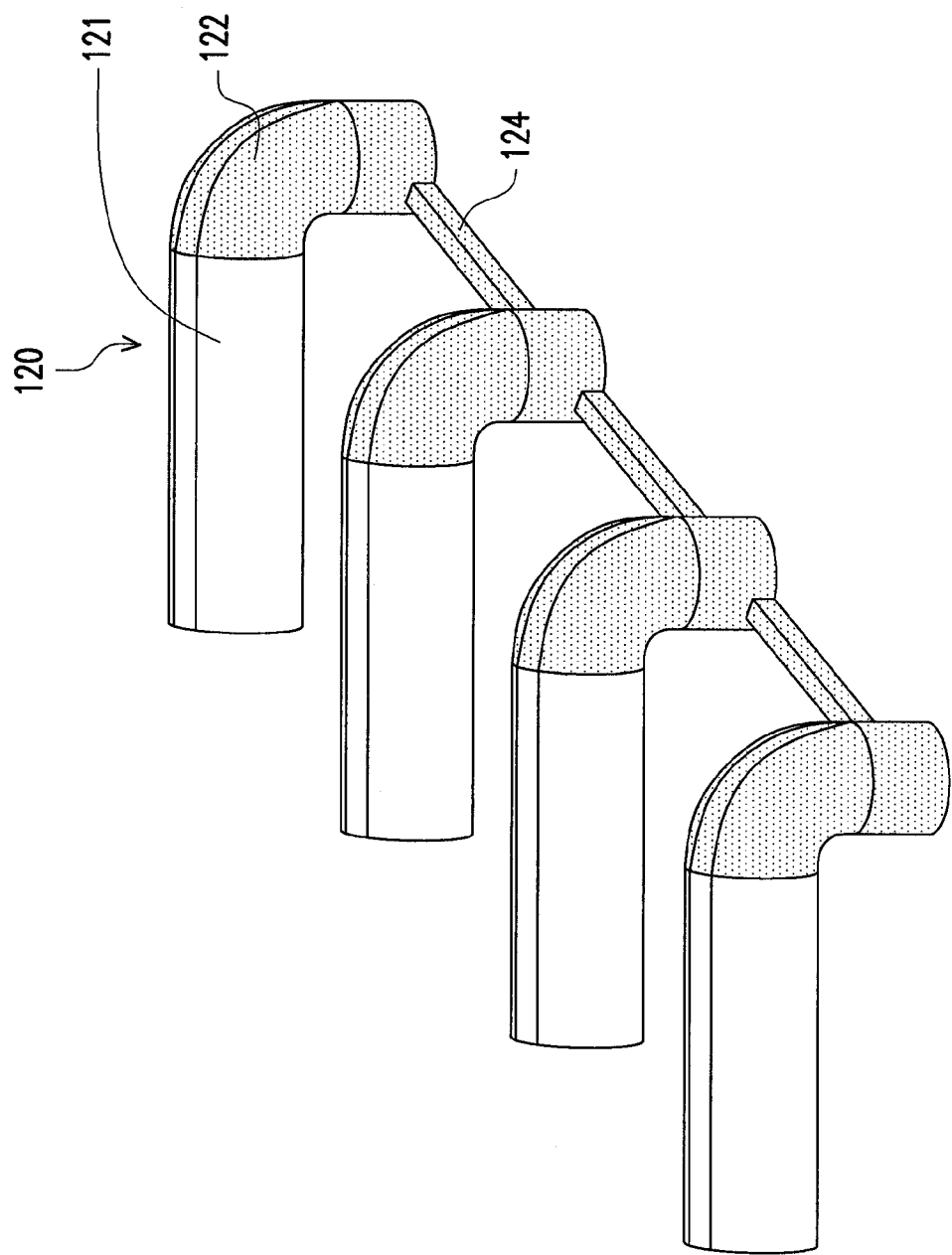
FIG. 3 is a schematic diagram illustrating a three-dimensional structure of a dielectric antenna in accordance with an embodiment of the disclosure.

FIG. 1 is a schematic cross-sectional view illustrating an antenna module in accordance with an embodiment of the disclosure. Referring to FIG. 1, the antenna module includes carrier board 100 and dielectric antenna 110, that is disposed on the carrier board 100. The dielectric antenna 110 of the embodiment is a formation of array from several dielectric units 120, which each unit has a bending portion. FIG. 3 would describe the structure in better detail. The dielectric antenna 110 in some embodiments can also be a single dielectric unit 120. In this embodiment, the formation of an array structure is provided by several dielectric units 120, in which the multiple dielectric units 120 as a dielectric antenna 110, can be assembled with the carrier board 100 at the same time, in order for the dielectric antenna 110 can easily be disposed at the predetermined position on the carrier board 100. The carrier board 100 contains many conductive layers, which including a conductive layer 102, referred as the first conductive layer, for grounding, and a conductive layer 104, referred as the second conductive layer, for feeding the signals. The structure of the conductive layer 102 includes multiple openings 106 on one side of the carrier board 100. The conductive layer 104 has multiple signal feeding structures 104'. Each signal feeding structure 104' respectively has one endpoint 104" corresponding to the opening 106. The dielectric units 120 are respectively configured on the openings 106. The dielectric units 120 are aligned with the openings 106, in which the signal feeding structure 104' can feed the signal into the dielectric unit 120 through the opening 106.

The carrier board 100 in an embodiment can at least have a third conductive layer 105 and a fourth conductive layer 107. The first conductive layer 102 and the third conductive layer 105 are electrically connected by the first conductive pole 108, and the second conductive layer 104 and the fourth conductive layer 107 are electrically connected by the second conductive pole 109. The signal feeding structure 104' of the second conductive layer 104 can constitute a signal transmission route and connect to the connection pad 114, through the at least one conductive layer and at least one conductive pole 113 in the carrier board 100.

The other side of the carrier board 100 can connect and integrate with at least one integrated circuit chip 116 by the connection pad 114, in order to coupled with the dielectric unit 120. The signal can be fed by the signal feeding structure 104' and the beam direction of antenna can be determined according to the dielectric unit 120. The at least one integrated circuit chip 116 can be a chip with the RF (Radio Frequency) module, or the foresaid chip combines with any other functional chips. The carrier board 100 can also have other connection pads 112, in order to connect with other circuits. The connection pads 112 and the connection pads 114 usually have the solder structure 115 thereon, such as solder balls in the embodiment for electrical connecting to other circuit boards.

Figure 2:
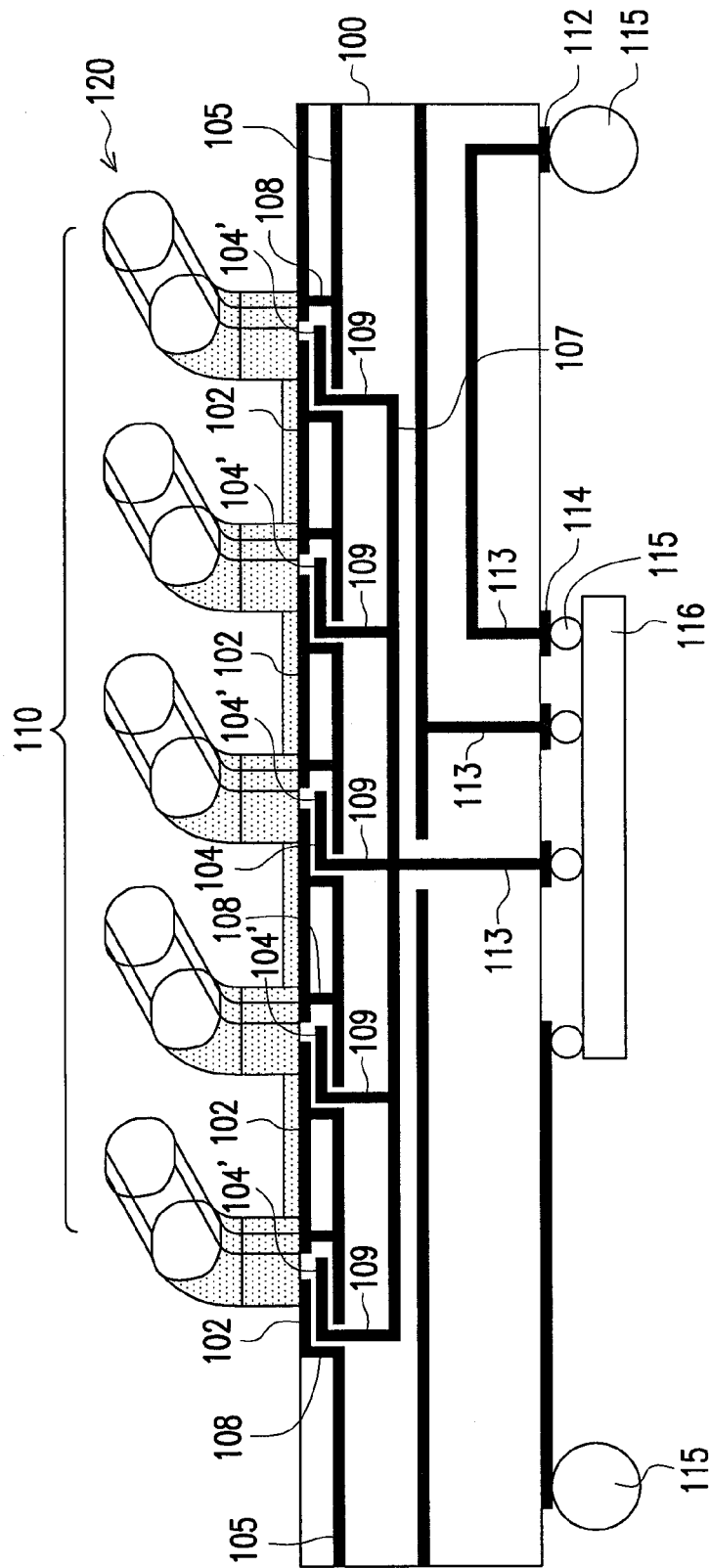
FIG. 2 is a schematic cross-sectional view illustrating an antenna module after being assembled in accordance with an embodiment of the disclosure.

FIG. 2 is a schematic cross-sectional view illustrating an antenna module after being assembled in accordance with an embodiment of the disclosure. Referring to FIG. 2, the dielectric antenna 110 can be disposed on the carrier board 100 corresponding to the location of openings 106. The dielectric antenna 110, for instance, can be fabricated by the plastic injection molding, which the dielectric units 120 can be placed at the intended locations corresponding to the openings 106, to form an integrated structure.

Figure 4:
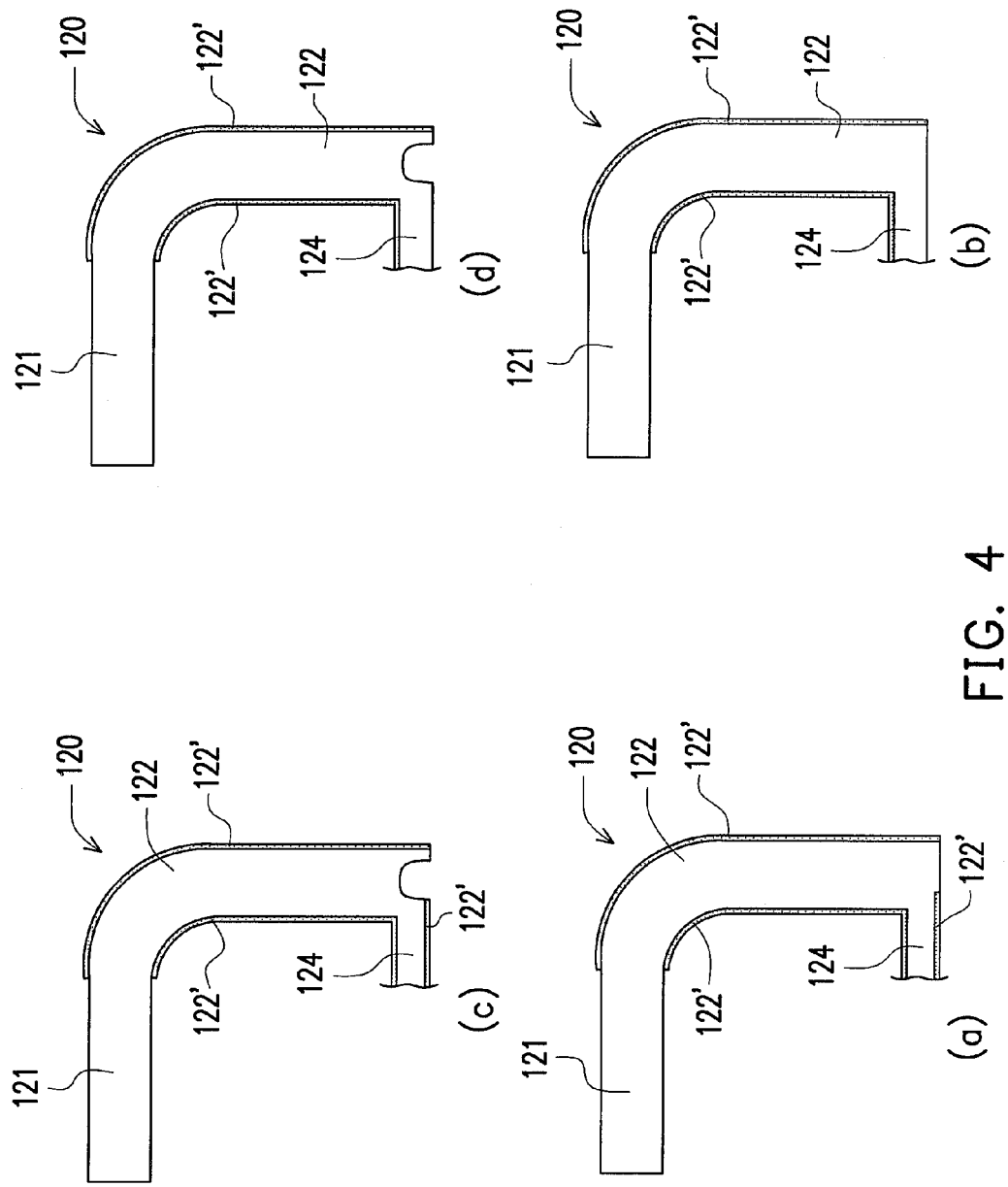
FIG. 4 is a schematic cross-sectional view illustrating several different structures of a dielectric unit in accordance with an embodiment of the disclosure.

FIG. 3 is a schematic diagram illustrating a three-dimensional structure of a dielectric antenna in accordance with an embodiment of the disclosure. The dielectric antenna 110 can be the dielectric rod antenna (DRA) but the detailed description of example embodiments is not limited to it. FIG. 4 is a schematic cross-sectional view illustrating several different structures of a dielectric unit in accordance with an embodiment of the disclosure. Referring to FIG. 3 and FIG. 4, it includes at least one dielectric unit 120, which can be separated into a first region 121 and a second region 122. The second region 122 has a bending portion. In addition, at least one conductive structure covering the surface of the second region 122 of the dielectric unit 120, form a waveguide structure 122'. A first endpoint of the waveguide structure 122' is connected with the first region 121. The second endpoint of the waveguide structure 122' is a signal feeding terminal 123, corresponding to one of the openings 106 on the first conductive layer 102. The signal feeding structure 104' in FIG. 1 feeds the signal into the signal feeding terminal 123 of the waveguide structure 122'. The second region 122 guides the electromagnetic energy into the first region 121 and the electromagnetic wave is radiated out from the first region 121 of the dielectric unit. The endpoint 104" of the signal feeding structure 104' is adjacent to the signal feeding terminal 123 of the waveguide structure, and is respectively disposed to the corresponding waveguide structure 122', in order for the signal feeding terminal 123 of the waveguide structure 122' to feed or receive signals.

Since the dielectric unit 120 can have a bending portion, the various antenna beam directions are provided by different bending angles. Since the multiple dielectric units 120 can constitute the antenna array, the antenna directivity can be improved. The signal feeding terminal of the waveguide structure for each dielectric unit 120 is aligned and assembled to the position of opening 106 in FIG. 1. When the number and related density of the dielectric unit 120 of the dielectric antenna 110 increases, the processes of assembly and fabrication do not exclude the single dielectric unit 120 assembling separately. However, if it is assembled one by one, the alignment for each individual would be required to be separately performed.

An embodiment of the disclosure is further provided from the antenna module 110, which is formed by the dielectric unit 120. The application of at least one interconnect structure 124 is connecting one or more dielectric units 120 of the dielectric antenna 110 together to constitute an integrated structure. The structure in this embodiment is based on a single integrated structure, therefore, when assembling to the carrier board 100, the embodiment just requires one alignment to simplify the complexity of assembling. Notice that the interconnect structure 124 in FIG. 4 may require additional description, this is due to the schematic diagram just illustrates the interconnect relationship with the second region 122. However, the interconnect structure 124 at the cross-section plane in FIG. 3 and FIG. 4 is not visible.

It should be further noted that in FIG. 4, the second region 122 of the dielectric unit 120 is covered by at least one conductive structure. In some embodiments, the covering conductive structure can cover a part of the surface or a complete surface of the interconnect structure 124, which are shown in sub-diagrams (a)-(d). The interconnect structure can be covered by at least one conductive structure, or the conductive structure covering the second region can extend the covering interconnect structure. In addition, the surface of the dielectric unit 120 at the signal feeding terminal can also have a concave shape (not shown in drawing) for matching adjustment.

The dielectric antenna 110 includes the interconnect structure 124, for example, can also be applied by the process for the ceramic passive device or the plastic injection molding process, to complete the fabrication of multiple dielectric units 120 simultaneously. The maximum size of the cross-sectional interconnect structure 124 in an embodiment is less or equal to a critical value, also referred as the critical size, which the coupled electromagnetic energy between the adjacent connected dielectric units 120 can be effectively reduced. The critical size is not greater than a half wavelength of an operating signal. The critical size is half of the wavelength in an exemplary embodiment, with respect to the operating wavelength, and it is described in FIG. 7 in detail.

Figure 5:
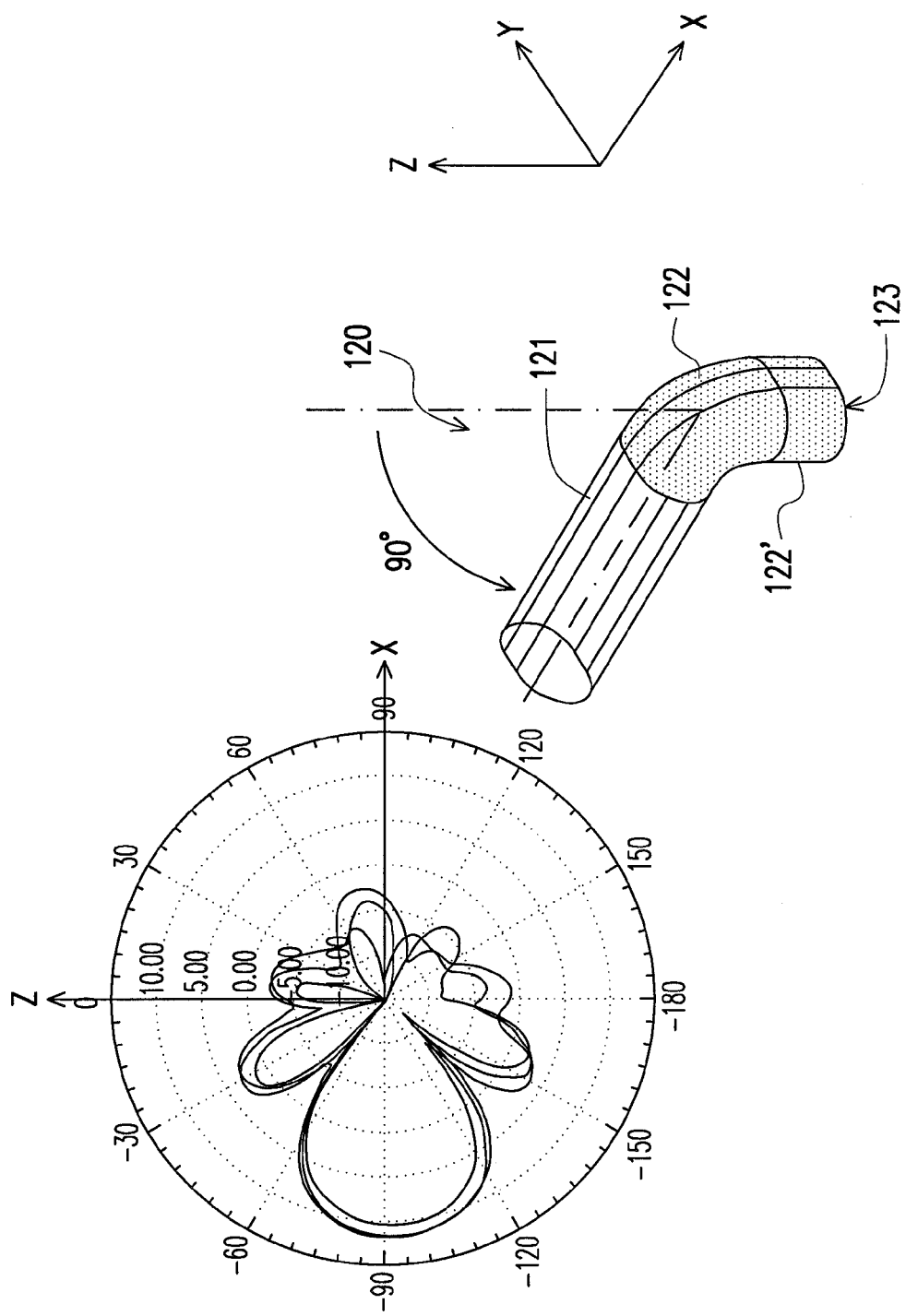
FIG. 5 is a schematic cross-sectional view illustrating an angular radiation pattern for the waveguide structure that covers the bending portion in accordance with an embodiment of the disclosure.

FIG. 5 is a schematic simulating diagram illustrating an angular radiation pattern for the waveguide structure without the interconnect structure, and when the second region 122 has a bending portion at a right angle. Referring to FIG. 5, if the second region 122 has a bending portion, the main beam of antenna is parallel to the axial direction of the first region and the level of directivity is relatively strong. The radius of curvature of the bending portion in an example can be 2 mm, which is about $0.4\lambda$ long relative to 5 mm of the operating wavelength.

Figure 6:
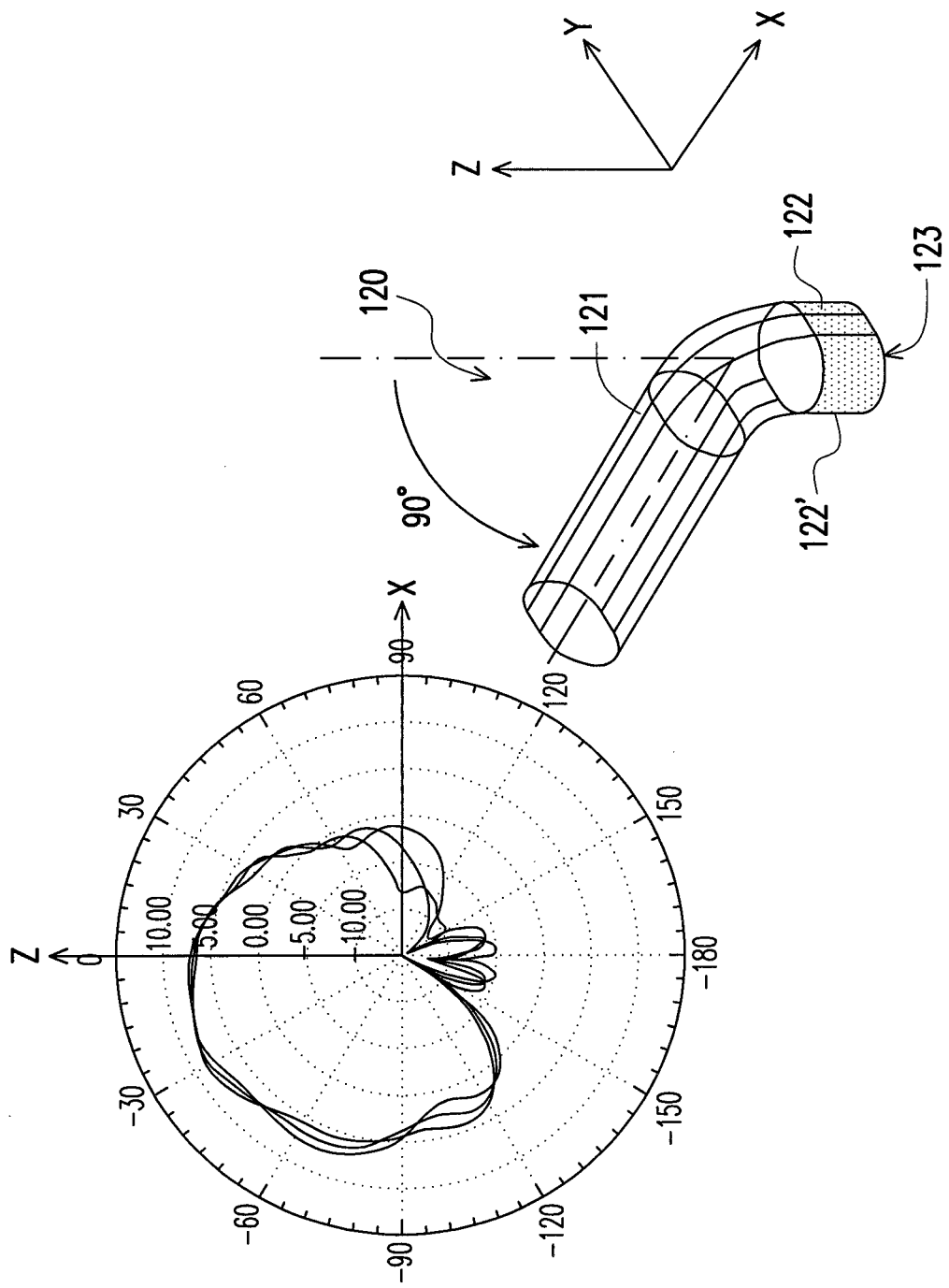
FIG. 6 is a schematic cross-sectional view illustrating an angular radiation pattern for the waveguide structure that does not cover the bending portion in accordance with an embodiment of the disclosure.

FIG. 6 is a schematic simulating diagram illustrating an angular radiation pattern for the waveguide structure without the interconnect structure, and when the second region 122 has no bending portion. Referring to FIG. 6, the first region has the bending portion at a right angle, but the second region has no bending portion. Therefore, in this situation, the main beam of antenna can not be concentrated along the straight-line axis at the first region (−x direction), and the level of directivity is weak, in comparison to FIG. 5.

The geometric shape of the cross-section for the dielectric unit 120 is not limited to a specific shape, for instance, it can be square, rectangular, circular, elliptic or any other shapes.

Figure 7:
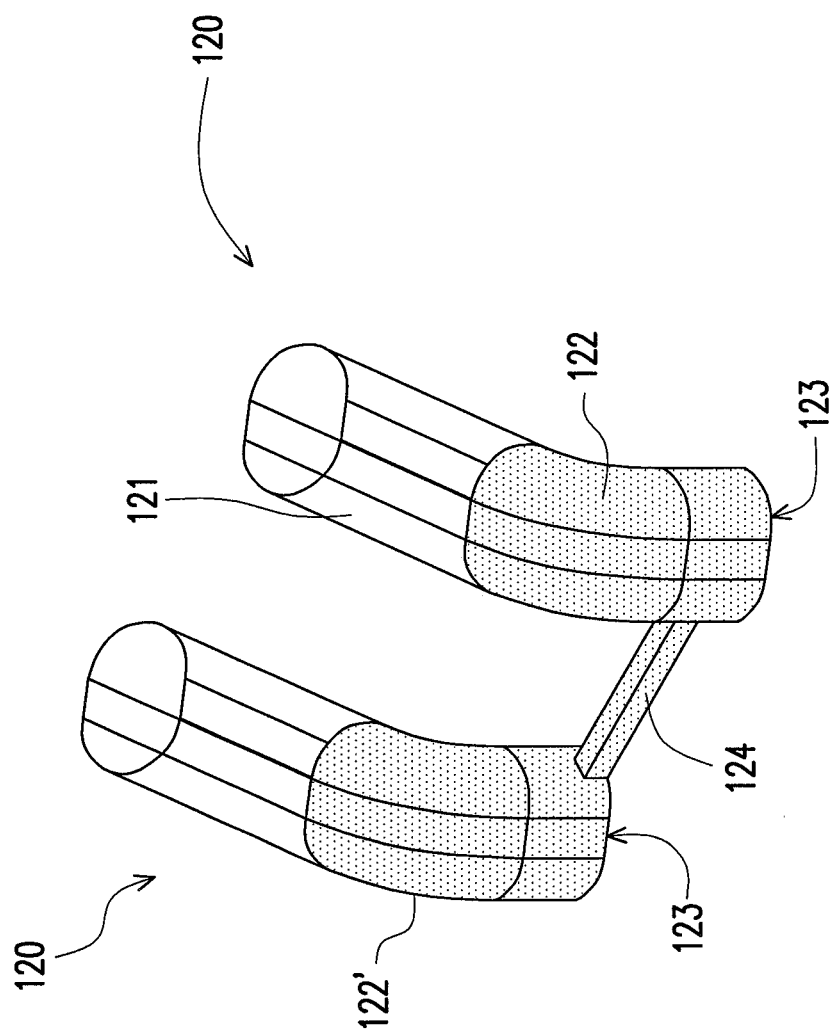
FIG. 7 is a schematic diagram illustrating an interconnect structure between two dielectric units in accordance with an embodiment of the disclosure.

Using two dielectric units 120 or at least two dielectric units 120, either adjacent or non-adjacent, can be connected by one or more interconnect structure 124 to form as a monolithic body. FIG. 7 is a schematic diagram illustrating an interconnect structure between two dielectric units in accordance with an embodiment of the disclosure. The materials for both the interconnect structure 124 and the second region 122 can be the same, consequently it can be fabricated by the process of the monocoque. The cross-sectional area of the interconnect structure 124 can be for example, square, rectangular, circular, elliptic or other shapes, in order to form a monocoque mechanically. The interconnect structure 124 simplifies the formation of the array structure, and also improves the ease of alignment when assembling to the carrier board.

In addition, the interconnect procedure for the interconnect structure 124 is not limited. For example, the interconnection can be cross-connected, leap-connected or any selected way to interconnect two or more dielectric units 120. For instance, the number of dielectric units 120 either an even or odd number, which are interconnected into an array.

Since the interconnect structure 124 may still have the waveguide effect, therefore, the coupling electromagnetic energy between two interconnected dielectric units 120 may occur. However, if the maximum cross-sectional width of the interconnect structure 124 is smaller than the critical size, the interconnect structure 124 at the stop-band can not sustain the electromagnetic energy propagation, yet this can reduce the electromagnetic energy coupling between the waveguide structures. Besides, the control of the cross-sectional width of the interconnect structure 124 can resolve the issue of energy coupling. In other words, the interconnect structure 124 with an appropriate size can reduce the leak of electromagnetic energy from each individual waveguide structure.

The bending manner for each sub-group or each dielectric unit 120 of the antenna module can have different arrangements to achieve the multiple wave beams in different directions. The wave beam angle for the dielectric unit 120 or the sub-group can be diverse, in the manner every wave beam is pointed in the different direction.

FIGS. 8A-8C are schematic diagrams illustrating several possible bending arrangements for the antenna module in accordance with an embodiment of the disclosure. Referring to FIG. 8A, the extended straight-line direction of the interconnect structure 124 is the x-axis. The axial orientation of the first region of the dielectric unit 120 is indicated by the dashed line, which have the included angles of $\phi$ and $\theta$, with respect to x-axis and z-axis. Furthermore, in an example, the bending angle $\theta$ is 90°, and the included angle $\phi$ is the variation on the horizontal plane. In the embodiment, the included angle $\phi$ is also 90°. Referring to FIG. 8B, an embodiment is illustrated in which the extended direction for the first region is made to be deviating from 90°. In this embodiment, the included angle $\phi$ is less than 90°. Referring to FIG. 8C, the dielectric antenna 110 is constituted by the different number of dielectric units 120. In other words, the extended direction for the firs region in dielectric units 120 and the number of the dielectric units 120 can be adjusted, according to the actual need.

Figure 9C:
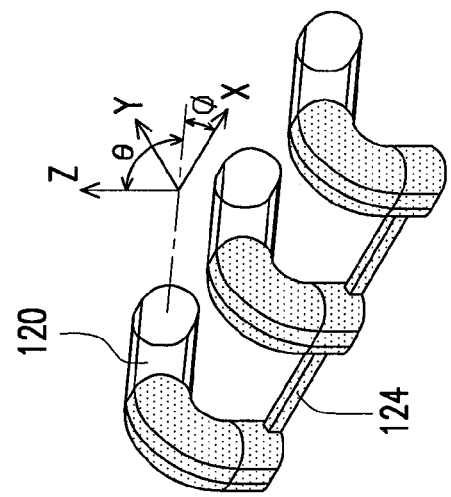
FIGS. 9A-9C are schematic diagrams illustrating other possible bending arrangements for the antenna module in accordance with an embodiment of the disclosure.
Figure 9B:
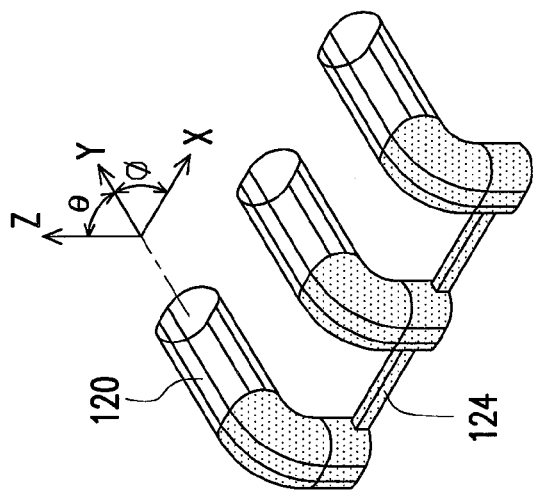
Figure 9A:
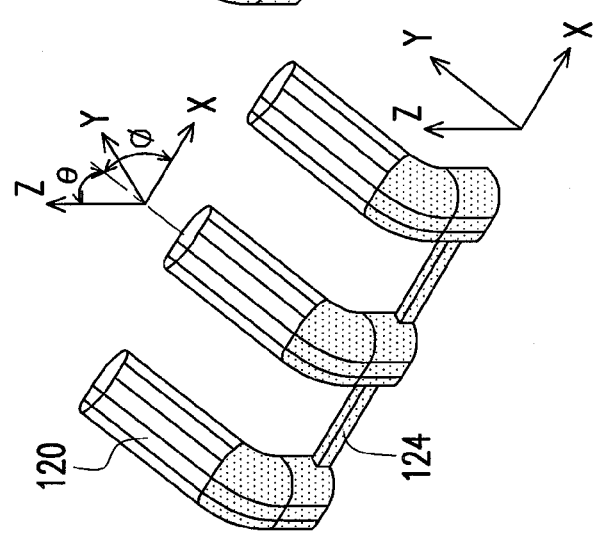

FIGS. 9A-9C are schematic diagrams illustrating other possible bending arrangements for the antenna module in accordance with an embodiment of the disclosure. Referring to FIG. 9A, the extended straight-line direction of the interconnect structure 124 is taken as the x-axis, and the axial orientation of the first region of the dielectric unit 120 is indicated by the dashed line, which have the included angles $\phi$ and $\theta$ with respect to x-axis and z-axis. Furthermore, the bending angle $\phi$ in this example is 90°. The included angle $\theta$ is the variation on the perpendicular plane. The embodiment takes the included angle $\theta$ to be less than 90°. Referring to FIG. 9B, in this example, the included angle $\theta$ is 90°. Referring to FIG. 9C, the included angle $\theta$ here is more than 90°. In the embodiments of FIGS. 9A-9C, the extended direction for the first region of the dielectric units 120 has different included angles, with respect to the z-axis.

In other words, the main wave beam direction of the dielectric antenna 110 can be determined by the bending angle of the second region 122 and the included angle of the interconnect structure 124.

For further application, the dielectric units 120 within the dielectric antenna 110 may be divided into multiple sub-groups, and each individual sub-group corresponds to a wave beam angle respectively in order for the antenna module to have multiple wave beam angles, or the single dielectric antenna 110 may correspond to one wave beam angle. For the multiple antenna groups on the carrier board 100, the requirement for the operating multiple wave beam directions can be carried out by the two aforementioned procedures.

Figure 10:
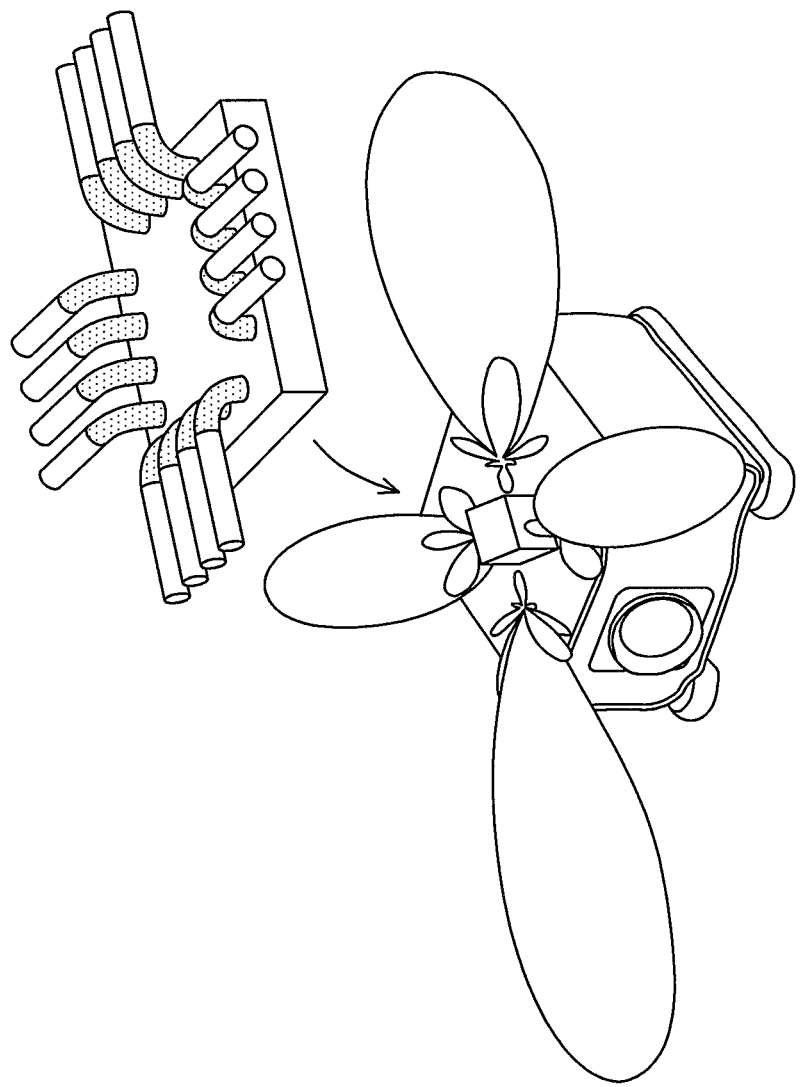
FIG. 10 is a schematic diagram illustrating a systematic application of the multiple beams on an electronic device such as a video projector that has an antenna module in accordance with an embodiment of the disclosure.

FIG. 10 is a schematic diagram illustrating a systematic application of the multiple beams on an electronic device that has an antenna module in accordance with an embodiment of the disclosure. Referring to FIG. 10, the structure is constituted with four wave beam directions, and is implemented on a video projector. As a result, the projector is capable of connecting with other apparatus by the wireless connection at these four wave beam directions. Since the projector allows data communication at the four wave beam directions, this increases the flexibility for allocating the projector in the surrounding environment. In this embodiment, the antenna group of the four wave beams is formed by the four unanimously bending antenna arrays. However, the layout of this embodiment is not the only option, and the disclosure is not limited to the embodiment.

Figure 11:
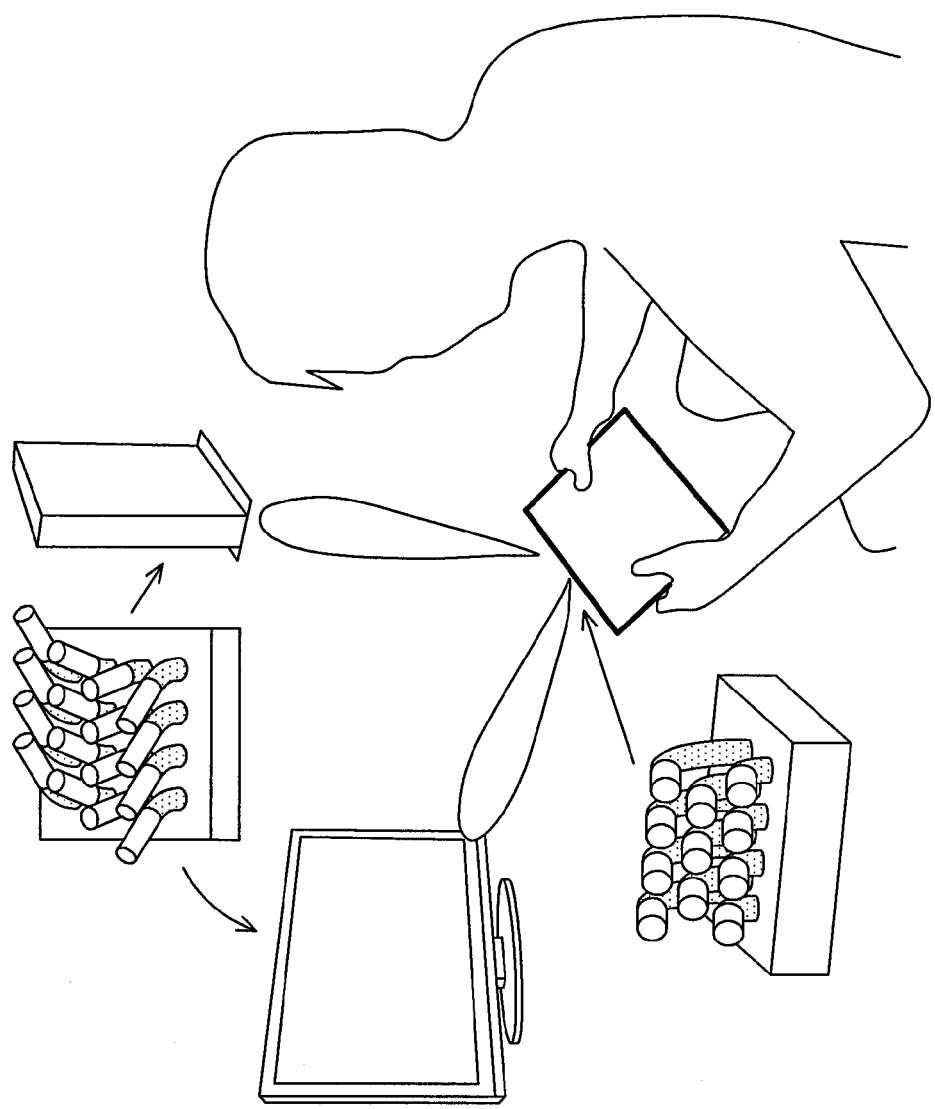
FIG. 11 is a schematic diagram illustrating a systematic application of the multiple beams on various electronic devices that have an antenna module in accordance with an embodiment of the disclosure.

FIG. 11 is a schematic diagram illustrating a systematic application of the multiple beams on various electronic devices that have an antenna module within, in accordance with an embodiment of the disclosure. Referring to FIG. 11, there can be different arrays that are formed by various bending directions for the same antenna group. In this situation, an operating location can simultaneously connect with various apparatus by wireless connection, to form a light-of-sight wireless network.

Figure 12:
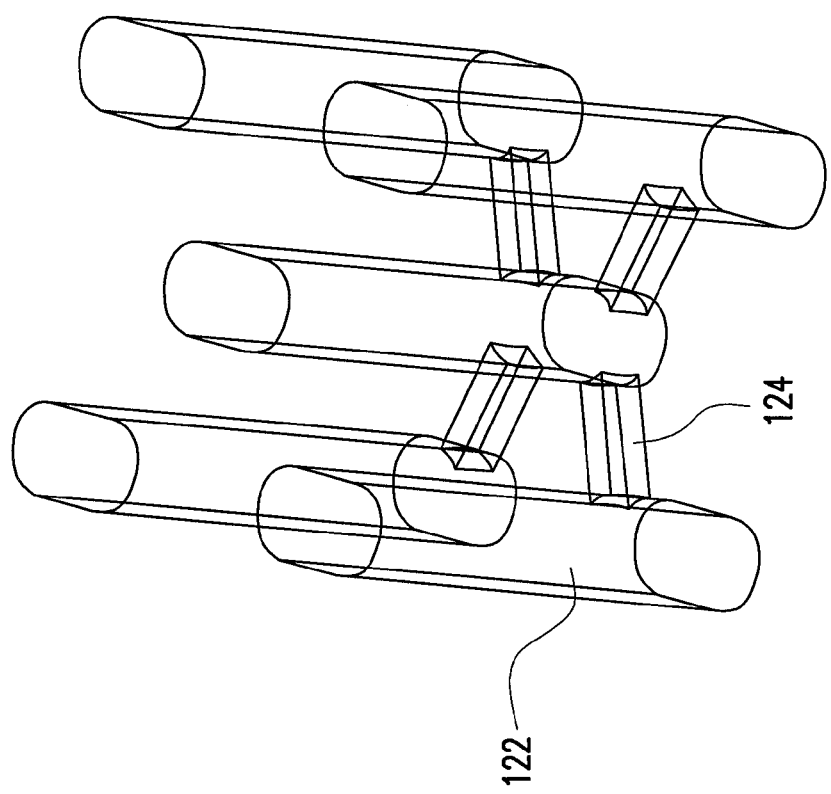
FIG. 12 is a schematic diagram illustrating an interconnect structure to form group of dielectric units in accordance with an embodiment of the disclosure.
Figure 14D:
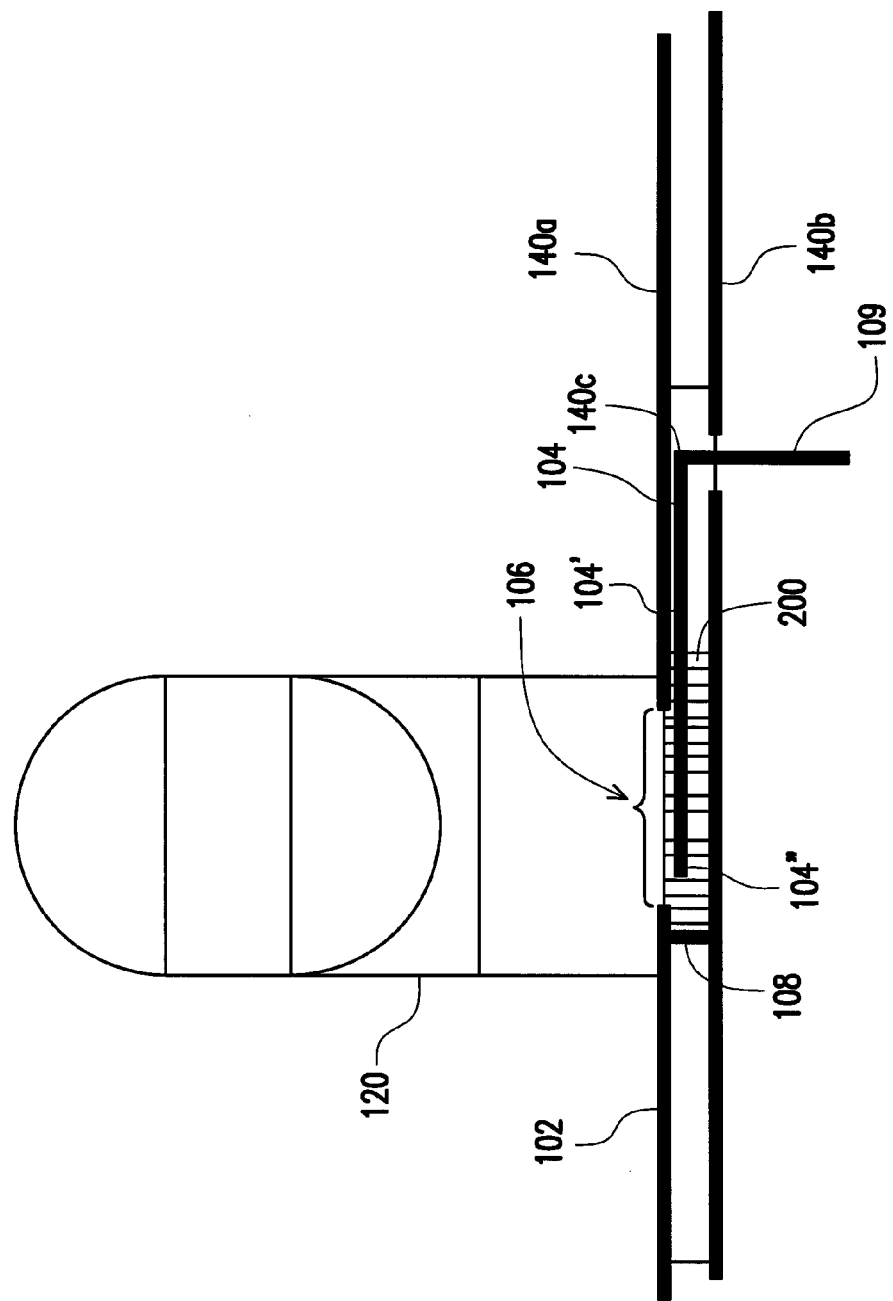

FIG. 12 is a schematic diagram illustrating an interconnect structure forming a group of dielectric units in accordance with an embodiment of the disclosure. Referring to FIG. 12, whether the dielectric unit 120 has been bent or not, the interconnect structure 124 can be used to interconnect with the second region, in order to form a monocoque. The embodiment uses the interconnect structure 124 to connect with the second regions 122 to form an array structure. Due to the interconnect structure 124, the array structure is not limited to an one-dimensional array, and the array structure may also be a two-dimensional array or any other array form.

In addition, the entire second region 122 can be the bending portion, or the second region 122 can also be a combination of bending and straight portions. In other words, not all parts of the second region 122 are required to have the bending portion. Furthermore, the bending portions can be all bending at the same angle or have diverse, multiple bending angles.

FIGS. 13A-13E are schematic diagrams illustrating a dielectric antenna with various interconnect structures in accordance with an embodiment of the disclosure. Referring to FIG. 13A, the second region 122 of the dielectric unit 120 in accordance with the interconnect structure 124 can achieve a monolithic array structure. In this embodiment, the second region 122 may not require to have the bending portion.

Referring to FIG. 13B, the dielectric unit 120 can achieve a monolithic array structure in accordance with the interconnect structure 124, and the second region 122 can be the combination of both a straight portion and a bending portion. Further referring to FIG. 13C, the dielectric unit 120 can achieve a monolithic array structure in accordance with the interconnect structure 124, and the second region 122 can have just the bending portion without the straight portion. Referring to FIG. 13D, the dielectric units 120 can achieve a monolithic array structure in accordance with the interconnect structure 124. Moreover, except the variations from FIGS. 13B-13C in the second region 122, the deflect direction of the dielectric unit 120 can be diverse and individually pointing at different directions. Referring to FIG. 13E, two separate antenna arrays form a larger-size monolithic antenna array, and the pointing direction of each antenna array can be respectively different.

In other words, according to the various combinations of the pillar-shaped dielectric units 120 as described in the foregoing embodiments, an antenna module can have multiple wave beams at the various directions.

FIGS. 14A-14D are respectively schematic, three-dimensional, side, top, and front perspective views illustrating the connection portion between the dielectric unit 129 and the carrier board in accordance with an embodiment of the disclosure. Referring to FIGS. 14A-14D, the conductive layer 102 for grounding in this embodiment is located at the surface with a depth 140a, which is zero with respect to the top surface. In the embodiment, multiple conductive poles 200 are embedded in the carrier board 100. The two endpoints of the conductive poles 200 at top and bottom are located at the depths 140a and 140b, and the depth for the signal feeding structure 104' is the depth 140c. When the distance between the conductive poles 200 is less than a given level, they can be treated as a complete conductive plane with respect to the operating band. Thus, it can be used to smoothly guide the electromagnetic signal feeding from the conductive layer 104 into the dielectric unit 120.

The conductive poles 200 are distributed and surrounded at the endpoint 104" of the signal feeding structure 104'. The conductive poles 200 are grounded and perpendicular to an extensional plane of the signal feeding structure 104'. The carrier board 100 of an embodiment can at least have a third conductive layer 105 and a fourth conductive layer 107. The first conductive layer 102 and the third conductive layer 105 are electrically connected by the first conductive pole 108. The second conductive layer 104 and the third conductive layer 107 are electrically connected by the second conductive pole 109.

Figure 15:
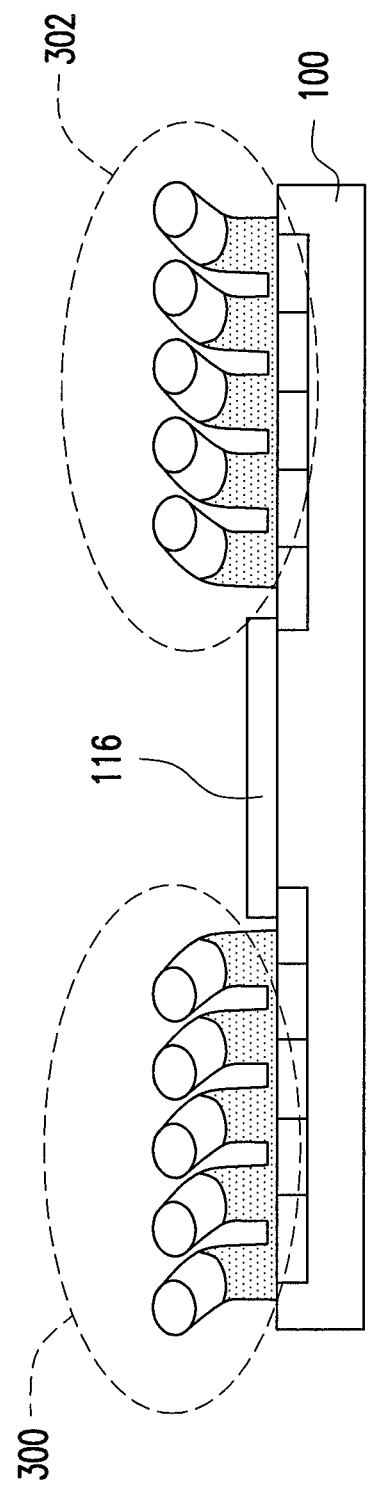
FIG. 15 is a schematic cross-sectional view illustrating the antenna module after being assembled in accordance with an embodiment of the disclosure.

FIG. 15 is a schematic cross-sectional view illustrating the antenna module after being assembled in accordance with an embodiment of the disclosure. Referring to FIG. 15, if the antenna module is constituted of multiple antenna arrays 300, 302, and it can be controlled by the same integrated circuit chip or at least one integrated circuit chip, which is electrically connect to the carrier board via the multiple conductor layers. The position of the chip can be properly disposed on the carrier board according to the circuit design and the multilayer characteristic of the carrier board.

In general, the length and shape for the first region of the dielectric unit 120 can be adjusted according to the actual requirement of the radiation strength and the pointing direction, without being limited to a specific geometric shape. If the second region employs the bending structure, the radius of curvature can also be adjusted according to actual requirements. The interconnect structure 124 can combine various dielectric units 120 to form a monolithic structure, which can reduce the complexity of alignment during assembly.

It will be apparent to those skilled in the art that various modifications and variations can be made to the structure of the disclosure without departing from the scope or spirit of the disclosure. It is intended that the specification and examples be considered as exemplary only, with a true scope of the disclosure being indicated by the following claims and their equivalents.

What is claimed is:

1. A dielectric antenna, comprising:
   a plurality of dielectric units, each individual dielectric unit separated into a first region and a second region;
   at least one conductive structure, covering a surface of the second region of each individual dielectric unit to form a waveguide structure, wherein a first endpoint of the waveguide structure is connected to the first region, and a second endpoint of the waveguide structure is a signal feeding terminal;
   at least one interconnect structure, wherein the at least one interconnect structure is connected with the waveguide structure to form at least one integrated structure, wherein a cross-sectional width of the at least one interconnect structure is smaller than a critical size; and
   a signal feeding structure, with an endpoint adjacent to the signal feeding terminal of the waveguide structure for feeding or receiving signals.

2. The dielectric antenna of claim 1, wherein at least one of the second region has a bending portion.

3. The dielectric antenna of claim 1, wherein the plurality of dielectric units are divided into a plurality of groups, and each individual group has multiple wave beam angles.

4. The dielectric antenna of claim 1, wherein the critical size is not greater than a half wavelength of an operating signal.

5. The dielectric antenna of claim 1, further comprising a plurality of conductive poles that are distributed and surrounded the endpoint of the signal feeding structure and the plurality of conductive poles are grounded and perpendicular to an extensional plane of the signal feeding structure.

6. The dielectric antenna of claim 1, wherein the at least one conductive structure covers on a part of the surface or a complete surface of the at least one interconnect structure.

7. A dielectric antenna, comprising:
   a dielectric unit, which are separated into a first region and a second region, the second region has a bending portion;
   a conductive structure, covers a surface of the bending portion from the second region to form a waveguide structure, wherein a first endpoint of the waveguide structure is connected with the first region, and a second endpoint of the waveguide structure is a signal feeding terminal;
   a signal feeding structure, having an endpoint adjacent to the signal feeding terminal of the waveguide structure, for feeding or receiving signals; and
   a plurality of conductive poles that are distributed and surrounded the endpoint of the signal feeding structure and the plurality of conductive poles are grounded and perpendicular to an extensional plane of the signal feeding structure.

8. The dielectric antenna of claim 7, further comprising an interconnect structure, which the interconnect structure is connected with the waveguide structure, wherein a cross-sectional width of the interconnect structure is smaller than a critical size.

9. An antenna module, comprising:
   a carrier board, comprising a plurality of conductive layers, and the plurality of conductive layers comprising:
     a first conductive layer for grounding at a side of the carrier board, wherein the first conductive layer has a plurality of openings; and a second conductive layer, comprising a plurality of signal feeding structures respectively having an endpoint corresponding to one of the plurality of openings of the first conductive layer;

a plurality of dielectric units, which the individual dielectric unit is configured on a corresponding opening of the first conductive layer, respectively, wherein each of the plurality of dielectric units is separated into a first region and a second region; and at least one conductive structure, covers a surface of the second region of each individual dielectric unit to form a waveguide structure, and a signal feeding terminal of each individual waveguide structure respectively corresponds to one of the plurality of openings of the first conductive layer, wherein the endpoint of the plurality of signal feeding structures are disposed respectively to the corresponding waveguide structures, for feeding or receiving signals from the signal feeding terminal of each waveguide structure.

10. The antenna module of claim 9, wherein at least one of the second region has a bending portion.

11. The antenna module of claim 9, further comprising a plurality of conductive poles that are distributed and surrounded the endpoint of the plurality of signal feeding structures.

12. The antenna module of claim 9, further comprising at least one interconnect structure, which interconnects to the waveguide structure to form at least one integrated structure, and a cross-sectional width of the at least one interconnect structure is smaller than a critical size.

13. The antenna module of claim 12, wherein the critical size is not greater than a half wavelength of an operating signal.

14. The antenna module of claim 9, wherein the plurality of dielectric units of are divided into a plurality of groups, and each individual group has multiple wave beam angles.

15. The antenna module of claim 9, wherein the plurality of dielectric units are distributed to form an array.

16. The antenna module of claim 9, further comprising at least one integrated circuit chip electrically connected to the plurality of dielectric units by the carrier board.

17. A dielectric antenna, comprising:

a dielectric unit, which are separated into a first region and a second region, the second region has a bending portion;

a conductive structure, covers a surface of the bending portion from the second region to form a waveguide structure, wherein a first endpoint of the waveguide structure is connected with the first region, and a second endpoint of the waveguide structure is a signal feeding terminal; and an interconnect structure, which the interconnect structure is connected with the waveguide structure, wherein a cross-sectional width of the interconnect structure is smaller than a critical size.

* * * * *